US012669387B2

(12) United States Patent
Chen et al.

(10) Patent No.: US 12,669,387 B2
(45) Date of Patent: *Jun. 30, 2026

(54) DEVICE FOR DETECTING USER INPUT WITH FORCE SENSOR IN STEM THEREOF

(71) Applicant: PixArt Imaging Inc., Hsin-Chu County (TW)

(72) Inventors: Yen-Po Chen, Hsin-Chu County (TW); Hao-Che Liu, Hsin-Chu County (TW); Yen-Chang Chu, Hsin-Chu County (TW); Chih-Ming Sun, Hsin-Chu County (TW)

( * ) Notice: Subject to any disclaimer, the term of this patent is extended or adjusted under 35 U.S.C. 154(b) by 388 days.

This patent is subject to a terminal disclaimer.

(21) Appl. No.: 18/230,173

(22) Filed: Aug. 4, 2023

(65) Prior Publication Data

US 2023/0375419 A1 Nov. 23, 2023

Related U.S. Application Data

(63) Continuation of application No. 17/235,664, filed on Apr. 20, 2021, now Pat. No. 11,761,830, which is a continuation-in-part of application No. 17/130,103, filed on Dec. 22, 2020, now Pat. No. 11,733,109, which is a continuation of application No. 16/247,573, filed on Jan. 15, 2019, now Pat. No. 10,921,199.

(51) Int. Cl.
*G01L 1/14* (2006.01)
*H05K 1/03* (2006.01)
*H05K 1/11* (2006.01)

(52) U.S. Cl.
CPC ............ *G01L 1/144* (2013.01); *H05K 1/0393* (2013.01); *H05K 1/118* (2013.01); *H05K 2201/10151* (2013.01)

(58) Field of Classification Search
CPC ...... G01L 1/144; H05K 1/0393; H05K 1/118; H05K 2201/10151; H05K 1/162
See application file for complete search history.

(56) References Cited

U.S. PATENT DOCUMENTS

| | | | | |
|---|---|---|---|---|
| 9,389,708 | B2 * | 7/2016 | Hinson | ............... G06F 3/04164 |
| 10,921,199 | B2 * | 2/2021 | Sun | .......................... G01L 1/144 |
| 11,070,904 | B2 * | 7/2021 | Harjee | ................ H03K 17/962 |
| 11,463,797 | B2 * | 10/2022 | Harjee | ............... H03K 17/9625 |
| 11,478,068 | B2 * | 10/2022 | Sun | ....................... A61C 17/221 |

(Continued)

FOREIGN PATENT DOCUMENTS

| | | |
|---|---|---|
| CN | 111435101 A | 7/2020 |
| CN | 211860488 U | 11/2020 |

(Continued)

*Primary Examiner* — Freddie Kirkland, III
(74) *Attorney, Agent, or Firm* — BruceStone LLP; Joseph A. Bruce

(57) ABSTRACT

There is provided a force sensor including a substrate and a polymer material layer. The substrate has a circuit layout that includes a first electrode and a second electrode configured to form a capacitor therebetween. The polymer material layer covers at least on a space between the first electrode and the second electrode, and is used to change capacitance of the capacitor while being pressed. The force sensor is arranged inside a stem of an earphone for detecting the user input.

20 Claims, 16 Drawing Sheets

200

(56)                    References Cited

U.S. PATENT DOCUMENTS

| | | | | |
|---|---|---|---|---|
| 11,733,109 | B2 * | 8/2023 | Sun ......................... | G01L 1/144 |
| | | | | 73/780 |
| 11,761,830 | B2 * | 9/2023 | Chen ..................... | H05K 1/118 |
| | | | | 73/780 |
| 11,956,587 | B2 * | 4/2024 | Jeon ..................... | H04R 1/1041 |
| 12,133,042 | B2 * | 10/2024 | Harjee ................... | G06F 3/044 |
| 12,339,178 | B2 * | 6/2025 | Sun ......................... | H05K 3/323 |
| 2016/0124554 | A1 | 5/2016 | Lewis | |
| 2017/0350771 | A1 * | 12/2017 | Chern ....................... | G01L 1/18 |
| 2018/0266898 | A1 | 9/2018 | Yoon | |
| 2020/0100013 | A1 * | 3/2020 | Harjee ................... | G06F 3/044 |
| 2021/0219042 | A1 * | 7/2021 | Harjee ............... | H03K 17/975 |

FOREIGN PATENT DOCUMENTS

| | | | |
|---|---|---|---|
| CN | 212721863 | U | 3/2021 |
| JP | 2014115099 | A | 6/2014 |
| KR | 20110124416 | A | 11/2011 |
| TW | 201022421 | A | 6/2010 |

\* cited by examiner

200

200

200

200

700

800 providing a circuit board — S91 forming a drive electrode, a sensing electrode and traces respectively connecting to the drive electrode and the sensing electrode on the circuit board — S93 providing a polymer material layer — S95 overlapping the polymer material layer on the drive and sensing electrodes and adhering to the circuit board — S97

1000

200'

200"

DEVICE FOR DETECTING USER INPUT WITH FORCE SENSOR IN STEM THEREOF

CROSS REFERENCE TO RELATED APPLICATION

This application is a continuation application of U.S. patent application Ser. No. 17/235,664 filed on Apr. 20, 2021, which is a continuation-in-part application of U.S. patent application Ser. No. 17/130,103 filed on Dec. 22, 2020, which is a continuation application of U.S. patent application Ser. No. 16/247,573 filed on Jan. 15, 2019, the full disclosures of which are incorporated herein by reference.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to an earphone and, more particularly, to an earphone that detects the user input using a force sensor.

2. Description of the Related Art

Conventionally, a force sensor including a drive electrode and a sensing electrode is formed as an individual module. The drive electrode and the sensing electrode are then electrically connected to a circuit board via an additional connector.

For example, the force sensor provided in U.S. Patent Application No. 2017/0350771 A1 includes a top electrode 111, a bottom electrode 121 and a pair of force sensitive layers 112 and 122 to form an individual force sensor. The force sensor has to be connected to a driving circuit 222 and a sensing circuit 223 of a system 23 via a connector.

SUMMARY

The present disclosure provides a force sensor having a drive electrode and a sensing electrode directly laid, in the circuit board manufacturing process, on a circuit board without employing an additional connector, and a manufacturing method of the force sensor.

The present disclosure further provides a force sensor having a polymer material layer that is attachable and detachable repeatedly. When the polymer material layer is pressed, a dielectric constant thereof is changed accordingly.

The present disclosure further provides an earphone that detects the user input, including pressing and shaking, by arranging the force sensor inside a stem of the earphone.

The present disclosure provides a device for detecting user input including a stem and a force sensor. The stem has an inner surface surrounding an inner space. The force sensor is attached to one side, which is a plane surface, of the inner surface, and includes a substrate and a polymer material layer. The substrate is laid with a drive electrode and a sensing electrode on a first surface thereof. The polymer material layer covers on the drive electrode and the sensing electrode. The inner space is configured to contain a hard element which is configured to compress the polymer material layer when the stem is pressed.

The present disclosure further provides a device for detecting user input including a stem and a force sensor. The stem has an inner surface surrounding an inner space. The force sensor is attached to one side, which is a plane surface, of the inner surface, and includes a substrate, a drive electrode, a sensing electrode and a polymer material layer. The substrate is laid with a drive line and a sensing line on a first surface thereof. The drive electrode is electrically connected to the drive line. The sensing electrode is electrically connected to the sensing line. The polymer material layer is arranged between the drive electrode and the sensing electrode. The inner space is configured to contain a hard element which is configured to compress the polymer material layer when the stem is pressed.

The present disclosure further provides a device for detecting user input including a stem and a force sensor. The stem has an inner surface surrounding an inner space. The force sensor is attached to one side, which is a plane surface, of the inner surface, and includes a substrate and a polymer material layer. The polymer material layer is attached to one side of the substrate and has a changeable dielectric constant upon being pressed. The inner space is configured to contain a hard element which is configured to compress an opposite side of the one side of the force sensor when the stem is pressed.

In the embodiments of the present disclosure, the substrate is a printed circuit board (PCB) or a flexible circuit board (FCB).

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
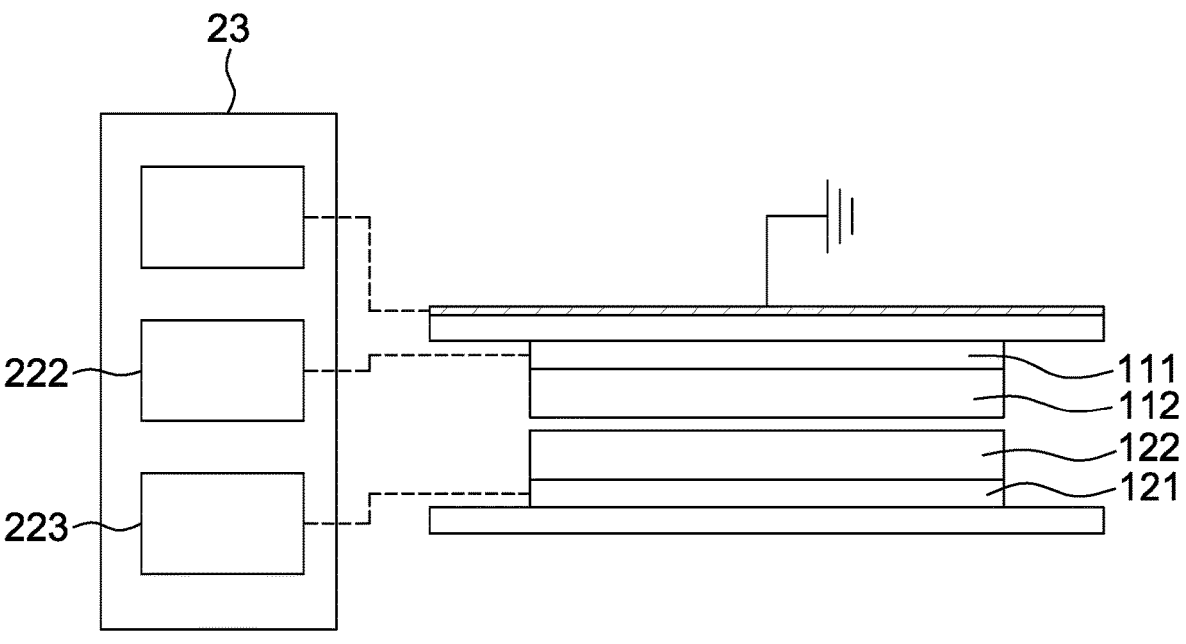
FIG. 1 is a schematic diagram of a conventional force sensor.
Figure 2A:
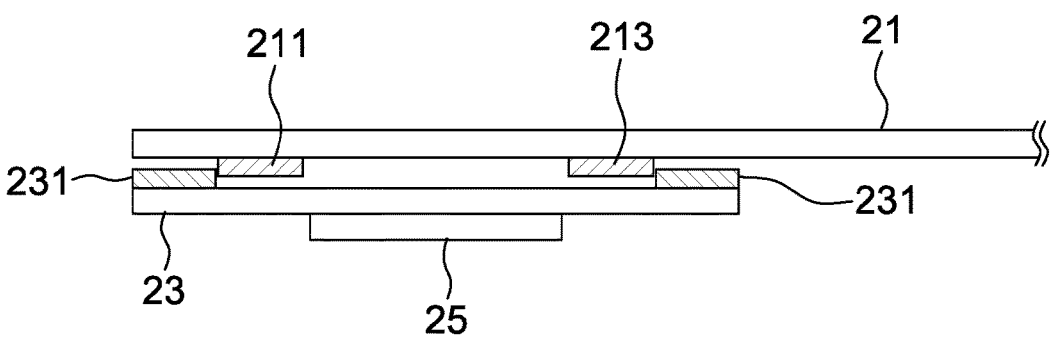
FIG. 2A is a schematic diagram of a force sensor, not being pressed, according to a first embodiment of the present disclosure.
Figure 2B:
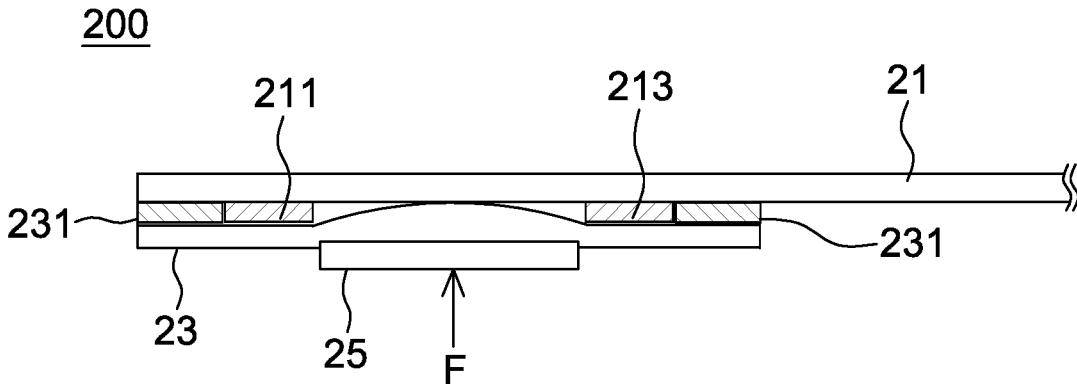
FIG. 2B is a schematic diagram of a force sensor, being pressed by a force, according to the first embodiment of the present disclosure.

Referring to FIGS. 2A and 2B, they are cross sectional views of a force sensor 200 according to a first embodiment of the present disclosure, wherein FIG. 2A shows the force sensor 200 not being pressed, and FIG. 2B shows the force sensor 200 being pressed by a force F such that a polymer material layer 23 is deformed upward. In the present disclosure, the polymer material layer 23 is selected from the material whose dielectric constant changes when the polymer material layer 23 is pressed by the force F. Accordingly, when the polymer material layer 23 is arranged between two electrodes supplied with electricity, capacitance of a capacitor between the two electrodes changes due to the change of the dielectric constant such that a force is detectable. For example, when the capacitance changes to exceed a threshold, a processor identifies that a force F is existing. In the present disclosure, said processor connects to the two electrodes via traces laid on the substrate 21.

In the present disclosure, a first surface (e.g., upper surface facing the substrate 21 in FIGS. 2A and 2B) of the polymer material layer 23 is not in contact with the substrate 21 or other circuits disposed on the substrate 21.

The force sensor 200 is applicable to various input devices that detect an input through detecting a press signal, e.g., a mouse, a keyboard, a remote controller, a touch pad or the like, but not limited to.

Figure 3:
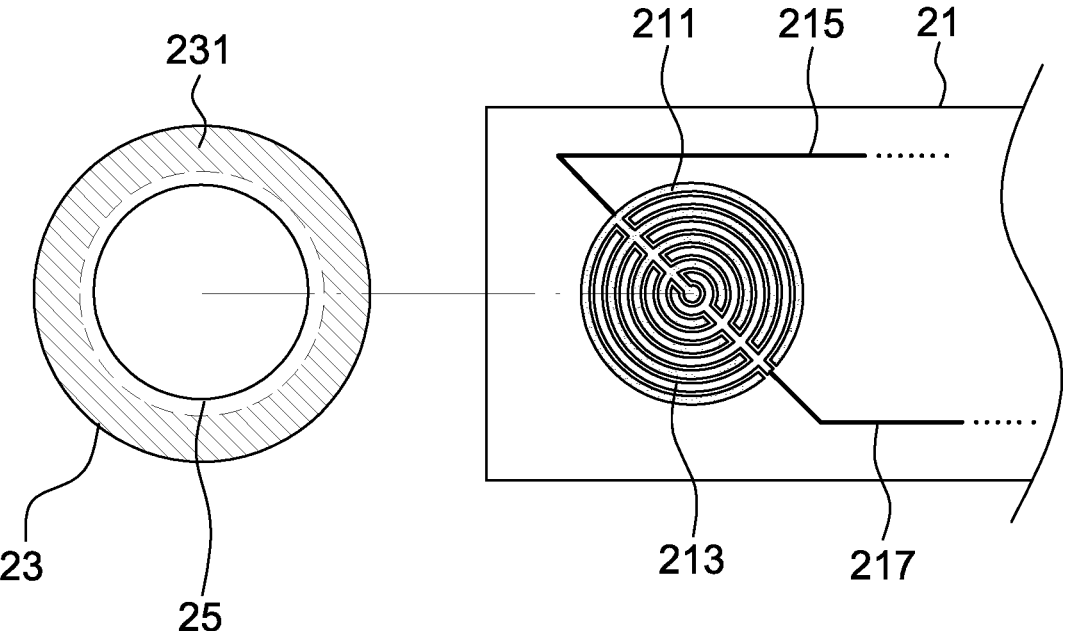
FIG. 3 is a top view of a force sensor according to one embodiment of the present disclosure.

Please referring to FIG. 3 together, it is a top view of a force sensor 200 according to one embodiment of the present disclosure. The force sensor 200 includes a substrate 21, a polymer material layer 23 and an adhesive layer 231. In some embodiments, the force sensor 200 further includes a bump 25 arranged on a second surface (FIGS. 2A-2B showing a bottom surface) of the polymer material layer 23 not facing the substrate 21. The bump 25 is used to allow an external force F to uniformly distribute on the polymer material layer 23, but the bump 25 is not necessary to be implemented. A cross sectional area of the bump is selected to be equal to or smaller than the polymer material layer 23 without particular limitations. A surface of the bump 25 not attaching to the polymer material layer 23 is a curved surface or a plane surface. The bump 25 is made of plastic or glass. For example, the bump 25 is arranged opposite to a bottom of a button on the applied device to receive a force from the button.

The substrate 21 is, for example, a printed circuit board (PCB) or a flexible circuit board (FCB) without particular limitations. The substrate 21 has a layout circuit that includes a drive electrode 211 and a sensing electrode 213, as well as multiple traces (e.g., FIG. 3 showing two traces 215, 217, but not limited to) respectively connecting to the drive electrode 211 and the sensing electrode 213. The drive electrode 211 and the sensing electrode 213 are coplanar arranged. In other words, in manufacturing the substrate 21, said multiple traces (conductive lines such as copper lines, gold lines or silver lines) are laid on the substrate 21 together with the drive electrode 211 and the sensing electrode 213. In addition, electrical contacts for disposing other electronic devices, e.g., a processor and a driving circuit, are also manufactured on the substrate 21.

The polymer material layer 23 covers on the drive electrode 211 and the sensing electrode 213. In one aspect, polymer material layer 23 also covers on a space (or air space) between the drive electrode 211 and the sensing electrode 213. When a force F is applied on the polymer material layer 23, a part of the polymer material layer 23 is squeezed into the space between the drive electrode 211 and the sensing electrode 213 to accordingly change capacitance of a capacitor therebetween. That is, in detecting a capacitance change between the drive electrode 211 and the sensing electrode 213, a distance (e.g., transverse distance in FIGS. 2A and 2B) between the drive electrode 211 and the sensing electrode 213 is not changed, and the capacitance change is caused by a change of electrical property of the polymer material layer 23 (even through without distortion) due to the external force F to change a detected signal of the sensing electrode 213. The polymer material layer 23 is selected from light transparent or opaque material without particular limitations.

The adhesive layer 231 is for adhering the polymer material layer 23 to the substrate 21. In one non-limiting embodiment, the adhesive layer 231 is arranged at an edge region of the polymer material layer 23 (as shown in FIG. 3) and adhering to a surface of the substrate 21. Accordingly, after the polymer material layer 23 is attached to the substrate 21, a capacitive force sensor is accomplished. As the electrode set (including drive and sensing electrodes) is directly manufactured on the surface of the substrate 21, said capacitive force sensor is not connected to the substrate 21 via an additional electrical connector. In one non-limiting embodiment, the adhesive layer 231 is selected from the material that can be repeatedly attached and detached such that it is possible to remove the polymer material layer 23 from the substrate 21 and adhere the polymer material layer 23 to the substrate 21 again via the adhesive layer 231.

Figure 2C:
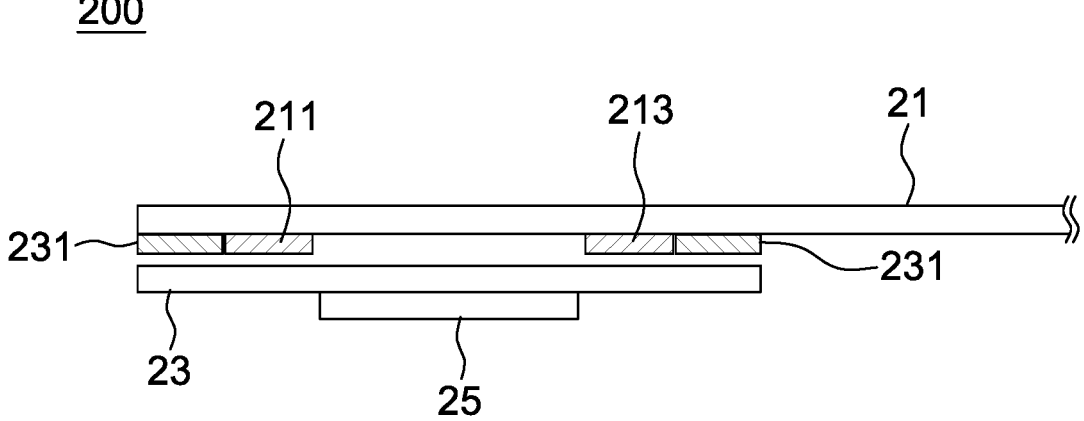
FIGS. 2C-2D are schematic diagrams of a force sensor according to some other embodiments of the present disclosure.

In some aspects, the adhesive layer 231 is firstly arranged on a surface of the substrate 21, as shown in FIG. 2C. The polymer material layer 23 is attachable to and detachable from the substrate 21 via the adhesive layer 231. For example, when the polymer material layer 23 is being removed from the substrate 21, the adhesive layer 231 is not removed at the same time.

Figure 2D:
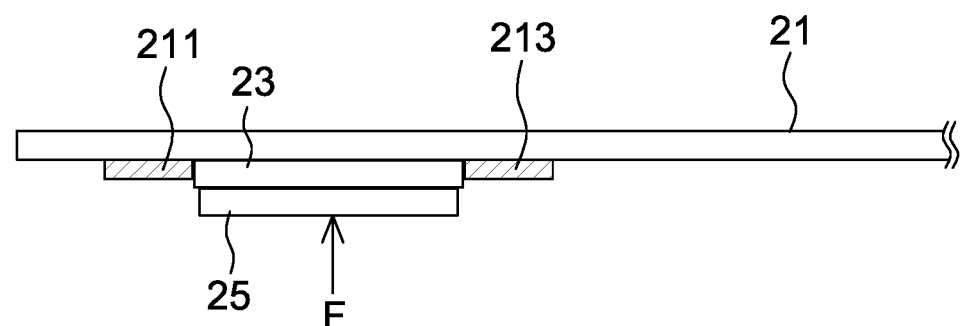

In alternative aspects, the polymer material layer 23 is directly printed or coated on a surface of the substrate 21 (covering the drive electrode 211 and the sensing electrode 213 or not) such that the adhesive layer 231 is omitted, as shown in FIG. 2D. In this case, an external force directly presses on the polymer material layer 23 or through a bump 25 to change the dielectric constant thereof.

Figure 4A:
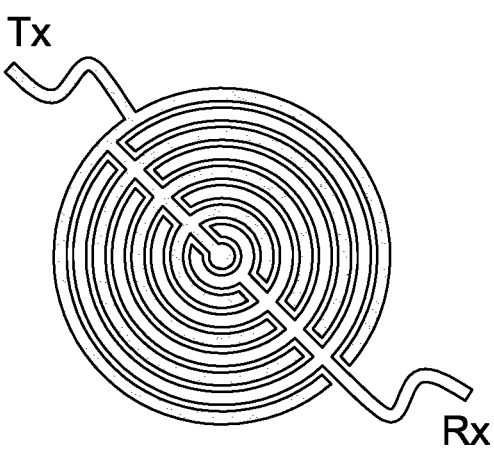
FIGS. 4A-4C are schematic diagrams of electrode patterns of a force sensor according to some embodiments of the present disclosure.
Figure 4B:
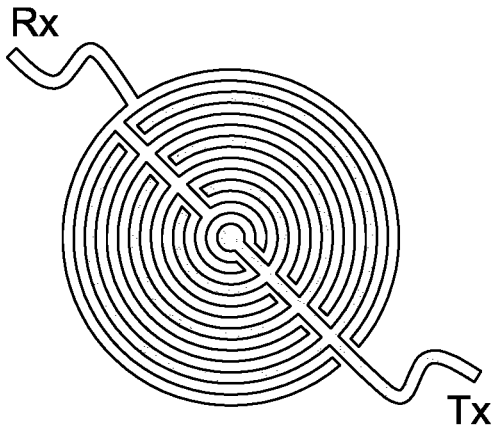
Figure 4C:
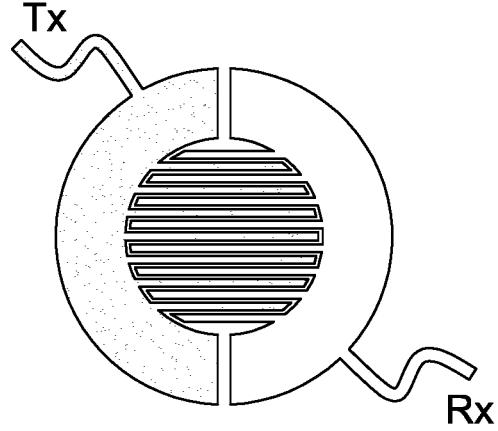

It should be mentioned that although FIGS. 2A and 2B only show one drive electrode 211 and one sensing electrode 213, it is only intended to simplify the drawing to show the distortion of the polymer material layer 23 while being pressed. However, it should be mentioned that the polymer material layer 23 is not necessary to be distorted to change the dielectric constant when the force F is pressing thereon. FIG. 2B is only intended to show a pressing state using the distortion of the polymer material layer 23 for easier understanding. In the present disclosure, the drive electrode Tx and the sensing electrode Rx are arranged properly, e.g. FIGS. 4A-4C showing different configurations, and preferably have a pitch therebetween within a predetermined distance range. The drive electrode Tx receives a drive signal via a trace (e.g., 215) from a driving circuit, and the sensing electrode Rx outputs a detected signal via a trace (e.g., 217) to a processor for identifying the pressing force.

In FIG. 4A, a drive electrode Tx and a sensing electrode Rx are arranged in a concentric circle, the electrode width is, for example, 200 micrometers and a pitch between the drive electrode Tx and the sensing electrode Rx is, for example, 150 micrometers. In FIG. 4B, a drive electrode Tx and a sensing electrode Rx are also arranged in a concentric circle, the electrode width is, for example, 150 micrometers and a pitch between the drive electrode Tx and the sensing electrode Rx is, for example, 250 micrometers. In FIG. 4C, a drive electrode Tx and a sensing electrode Rx are arranged as parallel straight lines, the electrode width is, for example, 200 micrometers and a pitch between the drive electrode Tx and the sensing electrode Rx is, for example, 200 micrometers.

Figure 7:
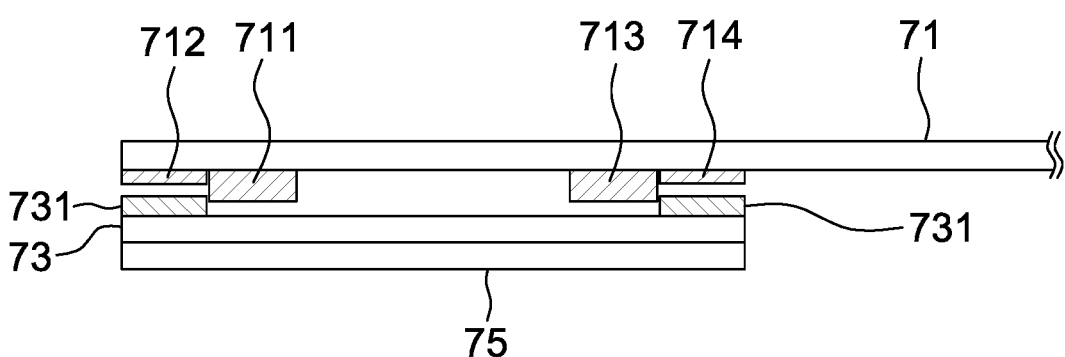
FIG. 7 is a cross sectional view of a force sensor according to a second embodiment of the present disclosure.

Referring to FIG. 7, it is a cross sectional view of a force sensor 700 according to a second embodiment of the present disclosure. The difference between the force sensor 700 and the force sensor 200 of FIG. 2A includes: (1) the substrate 71 of the force sensor 700 in FIG. 7 being further laid with metal layers 712, 714 during the substrate manufacturing process, and the metal layers 712, 714 being for adhering to the adhesive layer 731 to reduce a thickness of the adhesive layer 731; and (2) the bump 75 in FIG. 7 being shown to have a substantially identical size to the polymer material layer 73. The components of the force sensor 700 including the substrate 71, drive electrode 711, sensing electrode 713, adhesive layer 731 and polymer material layer 73 are identical to those of the first embodiment, and thus details thereof are not repeated herein.

Figure 8:
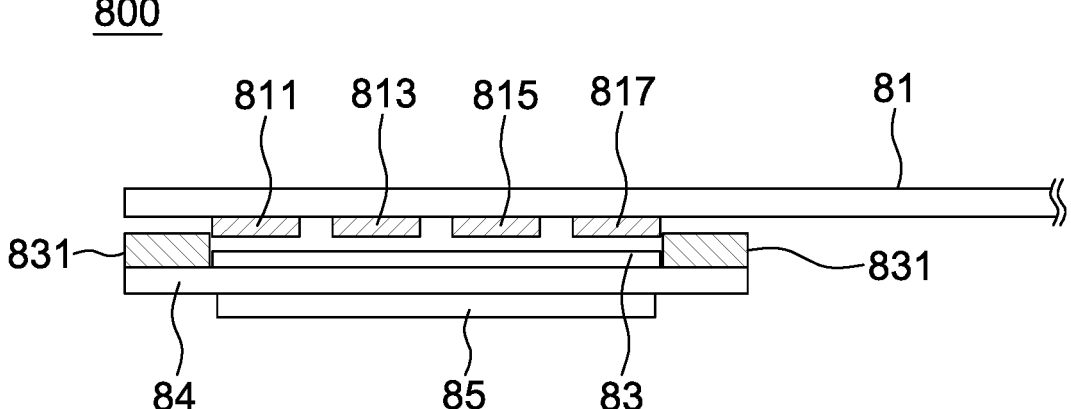
FIG. 8 is a cross sectional view of a force sensor according to a third embodiment of the present disclosure.

Referring to FIG. 8, it is a cross sectional view of a force sensor 800 according to a third embodiment of the present disclosure. The difference between the force sensor 800 and the force sensor 200 of FIG. 2A includes: (1) the force sensor 800 in FIG. 8 further including a carrying layer 84 attached to a surface (FIG. 8 showing a bottom surface) of the polymer material layer 83 not facing the substrate 81, and the carrying layer 84 being used to carry the polymer material layer 83; and (2) two sets of electrodes 811 and 813 as well as 815 and 817 being formed on the substrate 81 in FIG. 8. In this embodiment, an area of the carrying layer 84 is larger than that of the polymer material layer 83, and the adhesive layer 831 is arranged on the carrying layer 84. The material of the carrying layer 84 is selected to be identical to or different from that of the polymer material layer 83. In one non-limiting embodiment, the carrying layer 84 is an elastic plastic layer, a hard plastic layer or a double sided tape to combine the polymer material layer 83 and the bump 85. The components of the force sensor 800 including the substrate 81, drive electrodes 811 and 815, sensing electrodes 813 and 817, bump 85, adhesive layer 831 and polymer material layer 83 are identical to those of the first embodiment, and thus details thereof are not repeated herein.

Figure 5:
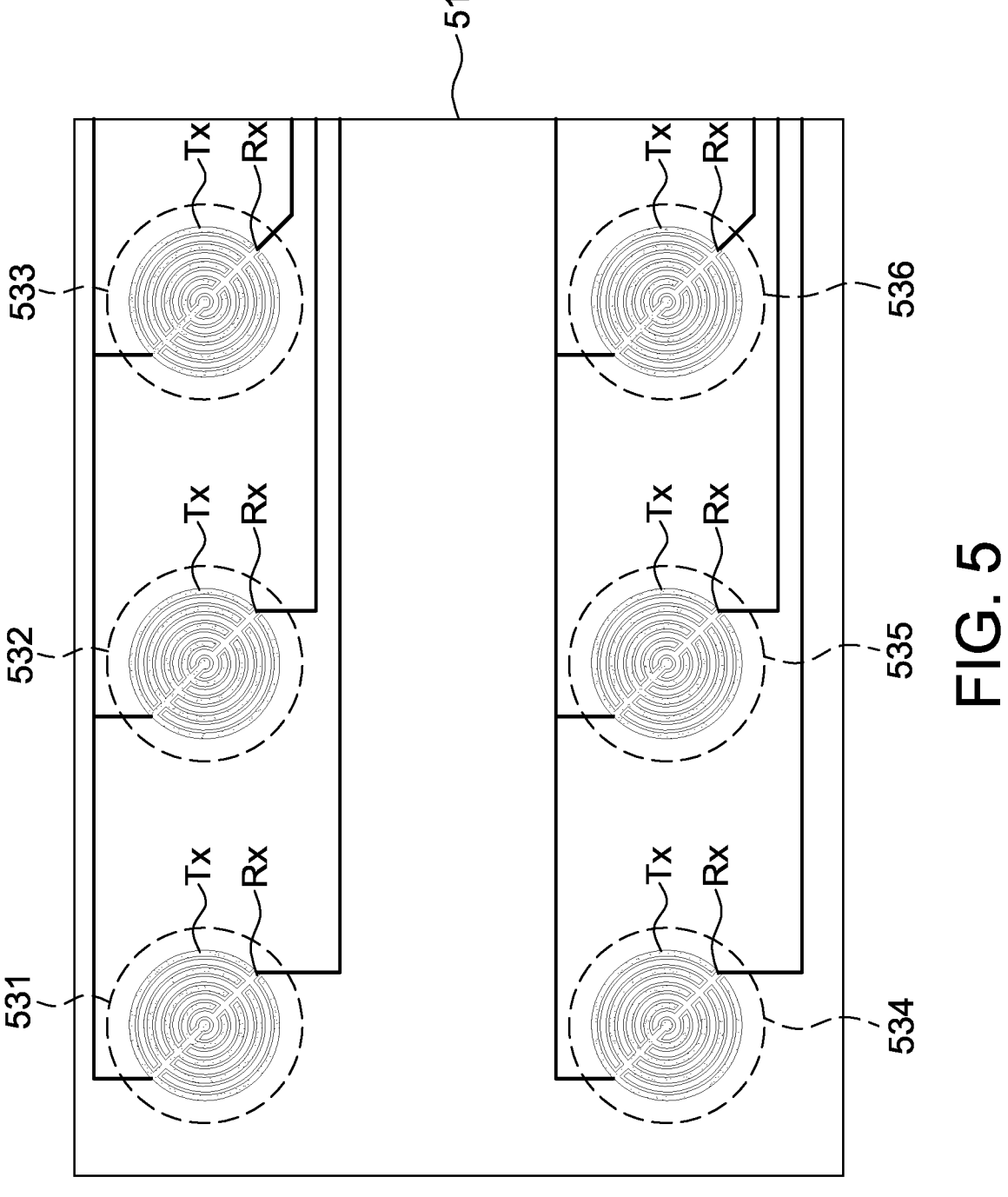
FIG. 5 is a configuration diagram of electrodes and polymer material layers of a force sensor according to one embodiment of the present disclosure.

Referring to FIG. 5, it is a configuration diagram of electrodes and polymer material layers of a force sensor according to one embodiment of the present disclosure. The substrate 51 is laid with multiple sets of drive electrodes Tx and sensing electrodes Rx, and also laid with a plurality of traces respectively connecting to the drive electrodes Tx and sensing electrodes Rx. Each set of drive electrode Tx and sensing electrode Rx is corresponding to one polymer material layer, e.g., 531-536 shown in FIG. 5, so as to form multiple force detecting points on the same substrate 51. The structure of each force detecting point is selected from FIG. 2A-3 or 7-8. The numbers and positions of the multiple force detecting points on the substrate 51 are determined according to actual applications as long as corresponding electrode sets are formed during manufacturing the circuit board. Multiple bumps are respectively arranged, optionally, on the polymer material layer 531-536 corresponding to each of the force detecting points.

Figure 6:
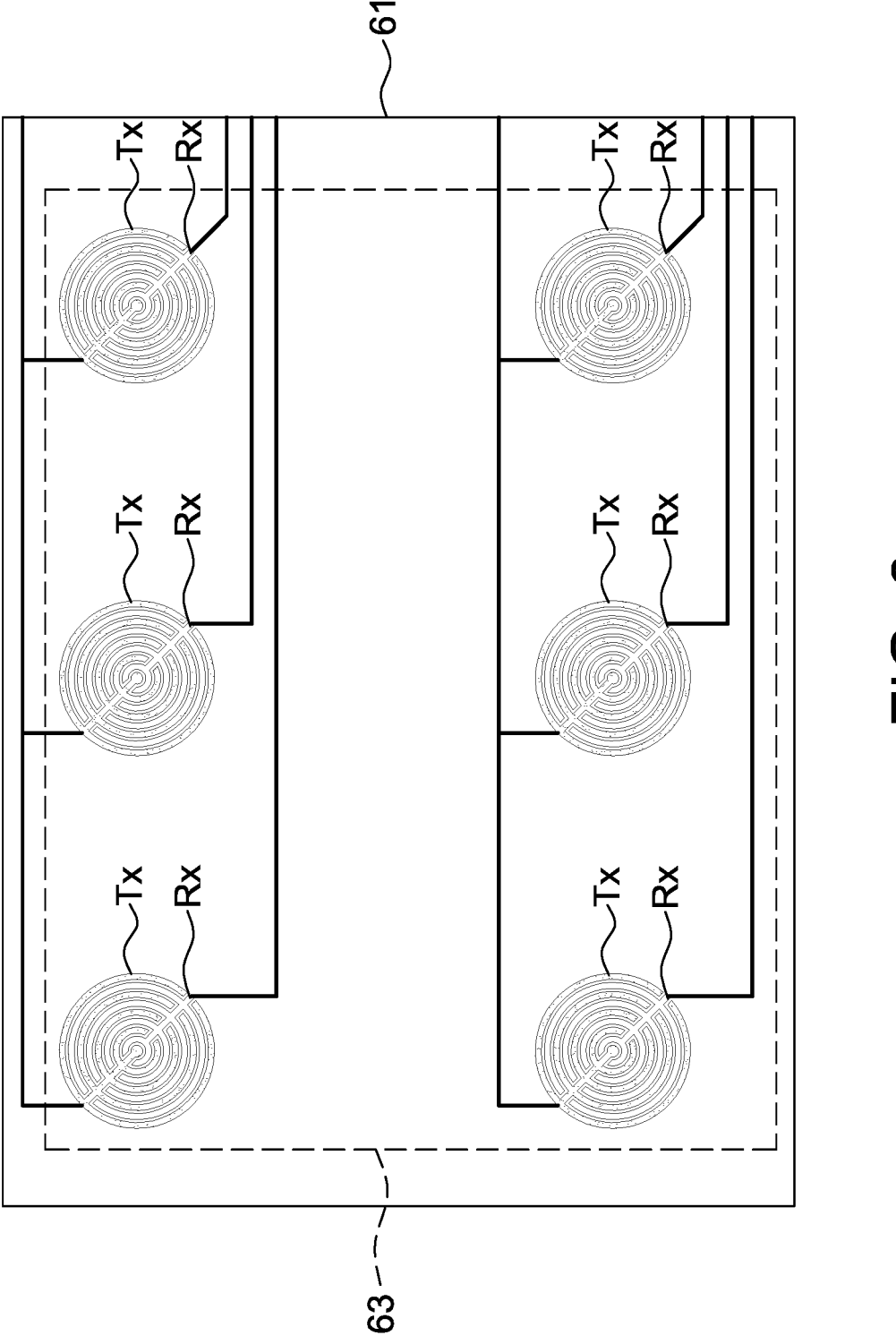
FIG. 6 is another configuration diagram of electrodes and a polymer material layer of a force sensor according to one embodiment of the present disclosure.

Referring to FIG. 6, it is another configuration diagram of electrodes and a polymer material layer of a force sensor according to one embodiment of the present disclosure. The force sensor also includes a substrate 61 and a polymer material layer 63. The substrate 61 has a circuit layout that includes multiple sets of drive electrodes Tx and sensing electrodes Rx, e.g., 6 sets of electrodes arranged in a matrix being shown in FIG. 6. The substrate 61 is further laid with a plurality of traces respectively connecting to the drive electrodes Tx and the sensing electrodes Rx.

In FIG. 6, the polymer material layer 63 is adhered to the substrate 61 and covering on the multiple sets of drive electrodes Tx and sensing electrodes Rx. The difference between FIG. 6 and FIG. 5 is that FIG. 6 employs one polymer material layer 63 to cover multiple electrode sets. Similarly, the polymer material layer 63 is adhered to the substrate 61 via an adhesive layer (not shown). In this embodiment, the adhesive layer is arranged surrounding and/or between the multiple electrode sets. The polymer material layer 63 is also attachable and detachable with the substrate 61.

Similarly, to allow an external force to distribute on the polymer material layer 63 uniformly, the force sensor in FIG. 6 further includes multiple bumps arranged on a surface of the polymer material layer 63 not facing the substrate 61, and each bump is corresponding to one set of drive electrode and sensing electrode, as shown in FIGS. 2A-3 and 7-8 for example. In one non-limiting embodiment, the force sensor in FIG. 6 further includes a carrying layer (as shown in FIG. 8) arranged on a surface of the polymer material layer 63 not facing the substrate 61. The carrying layer has the material identical to or different from the polymer material layer 63. If the carrying layer is used, it is an option to use the bump.

Figure 9:
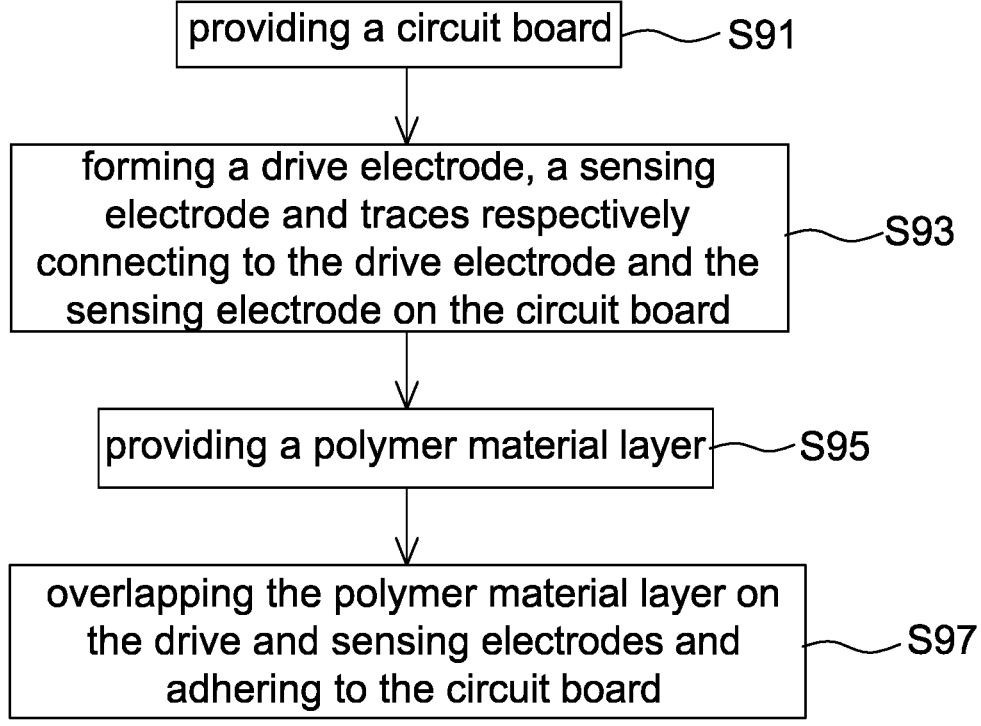
FIG. 9 is a flow chart of a manufacturing method of a force sensor according to one embodiment of the present disclosure.

Referring to FIG. 9, it is a flow chart of a manufacturing method of a force sensor according to one embodiment of the present disclosure, including the steps of: providing a circuit board (Step S91); forming a drive electrode, a sensing electrode and traces respectively connecting to the drive electrode and the sensing electrode on the circuit board (Step S93); providing a polymer material layer (Step S95); and overlapping the polymer material layer on the drive electrode and the sensing electrode and adhering to the circuit board (Step S97).

Referring to FIGS. 3 and 9 together, one aspect of this embodiment is described below.

Step S91: At first, a PCB or FCB is provided, and the circuit traces, electrodes and electrical contacts thereon are determined.

Step S93: Next, the drive electrode 211, the sensing electrode 213 and traces 215, 217 respectively connecting to the drive electrode 211 and the sensing electrode 213 are laid on the substrate 21 using the circuit board manufacturing process. It is appreciated that other traces and electrical contacts are also laid on the circuit board 21. The method of manufacturing a circuit board is known to the art, and thus details thereof are not repeated herein. As the drive electrode 211 and the sensing electrode 213 are already formed on the circuit board 21, an additional connector is no longer required.

Step S95: Next, at least one polymer material layer 23 is provided. The size and shape of the polymer material layer 23 are previously determined according to the range and pattern of the drive electrode 211 and the sensing electrode 213. Then, an adhesive layer 231 is arranged, e.g., coated or adhered, at a proper position on the polymer material layer 23. Accordingly to different electrode patterns, the adhesive layer 231 is arranged at different positions on the polymer material layer 23. In another aspect, the adhesive layer 231 is firstly arranged on the substrate 21 and then adhered to the polymer material layer 23 when combining the substrate 21 and the polymer material layer 23.

When the polymer material layer 23 is carried on a carrying layer, as shown in FIG. 8, the adhesive layer 231 could be selected to be arranged on the carrying layer. The bump 25 is arranged, optionally, on a surface of the carrying layer, and said surface does not face the substrate 21.

Step S97: Finally, the force sensor of the present disclosure is accomplished only by overlapping the polymer material layer 23 on the drive electrode 211 and the sensing electrode 231 and by adhering the polymer material layer 23 to the circuit board 21.

In addition, the bump 25 is arranged, optionally, on a surface of the polymer material layer 23 not facing the circuit board 21, wherein the number, size and position of the bump 25 are determined corresponding to the electrode configuration.

It should be mentioned that although the polymer material layer in figures of the present disclosure is shown to have a plane surface that faces the substrate, it is not to limit the present disclosure. In other embodiments, when the polymer material layer is attached to the electrodes, a part of the polymer material layer extends into a space between the electrodes, i.e., a surface of the polymer material layer facing the substrate is not a plane surface. The part of the polymer material layer attached to the electrodes is thinner, and the rest part of the polymer material layer between the electrodes is thicker.

Figure 10A:
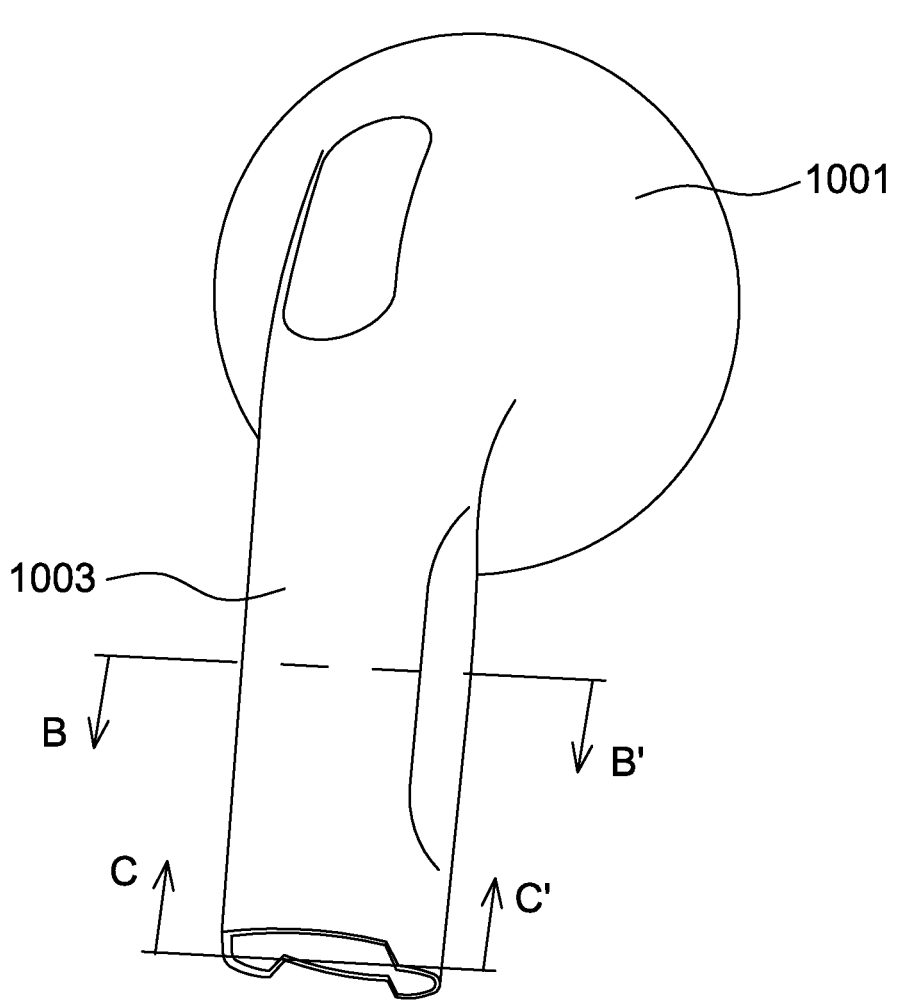
FIG. 10A is a solid diagram of an earphone adopting a force sensor of the present disclosure.

The force sensors 200, 700 and 800 of the present disclosure mentioned above are arranged, for example, in an earphone 1000 shown in FIG. 10A to detect the user input, e.g., including pressing and/or shaking. The earphone 1000 includes a speaker 1001 and a stem 1003. The stem 1003 extends downward from a casing of the speaker 1001, and is formed as a hollow tube to contain other elements. The force sensor 200, 700 or 800 is arranged inside the stem 1003. The arrangement of the speaker 1001 inside the earphone 1000 is known to the art and not a main objective of the present disclosure, and thus details thereof are not described herein.

Figure 10B:
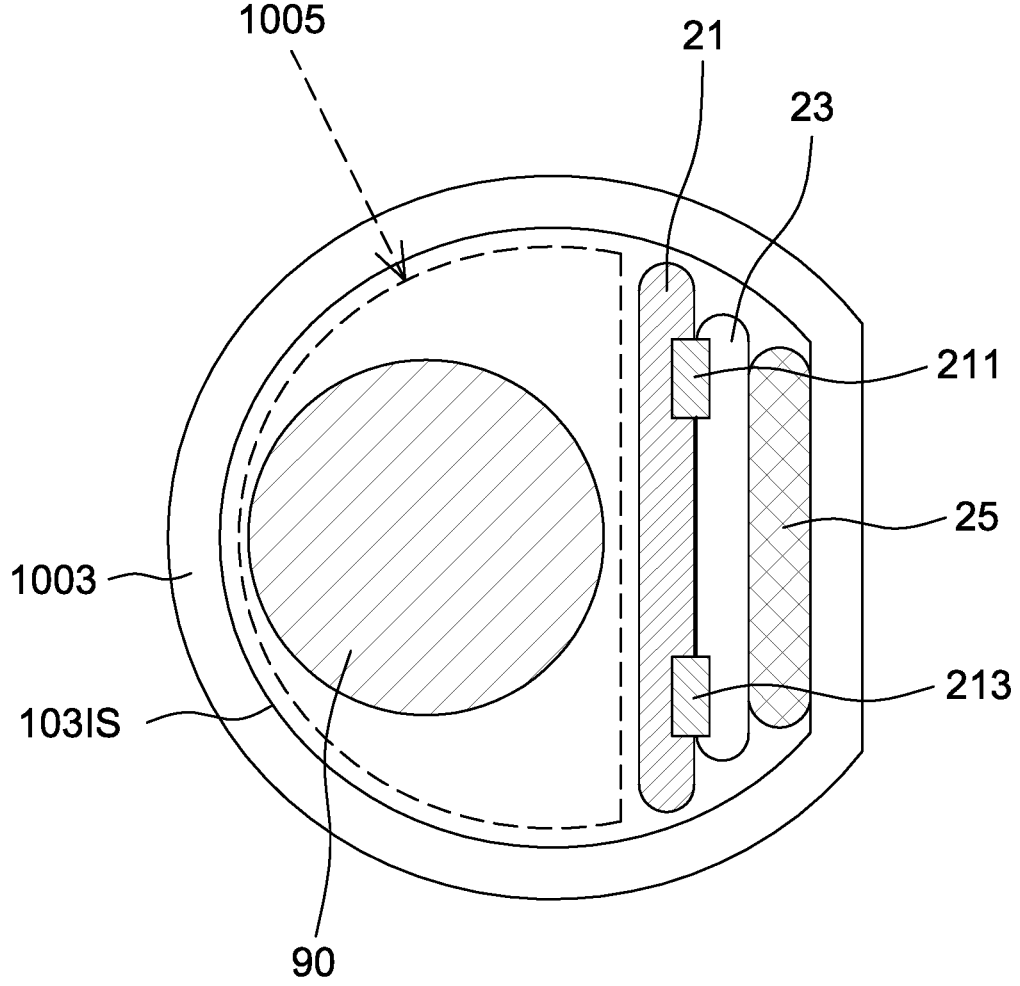
FIG. 10B is a cross sectional view along line B-B' in the earphone of FIG. 10A.
Figure 10C:
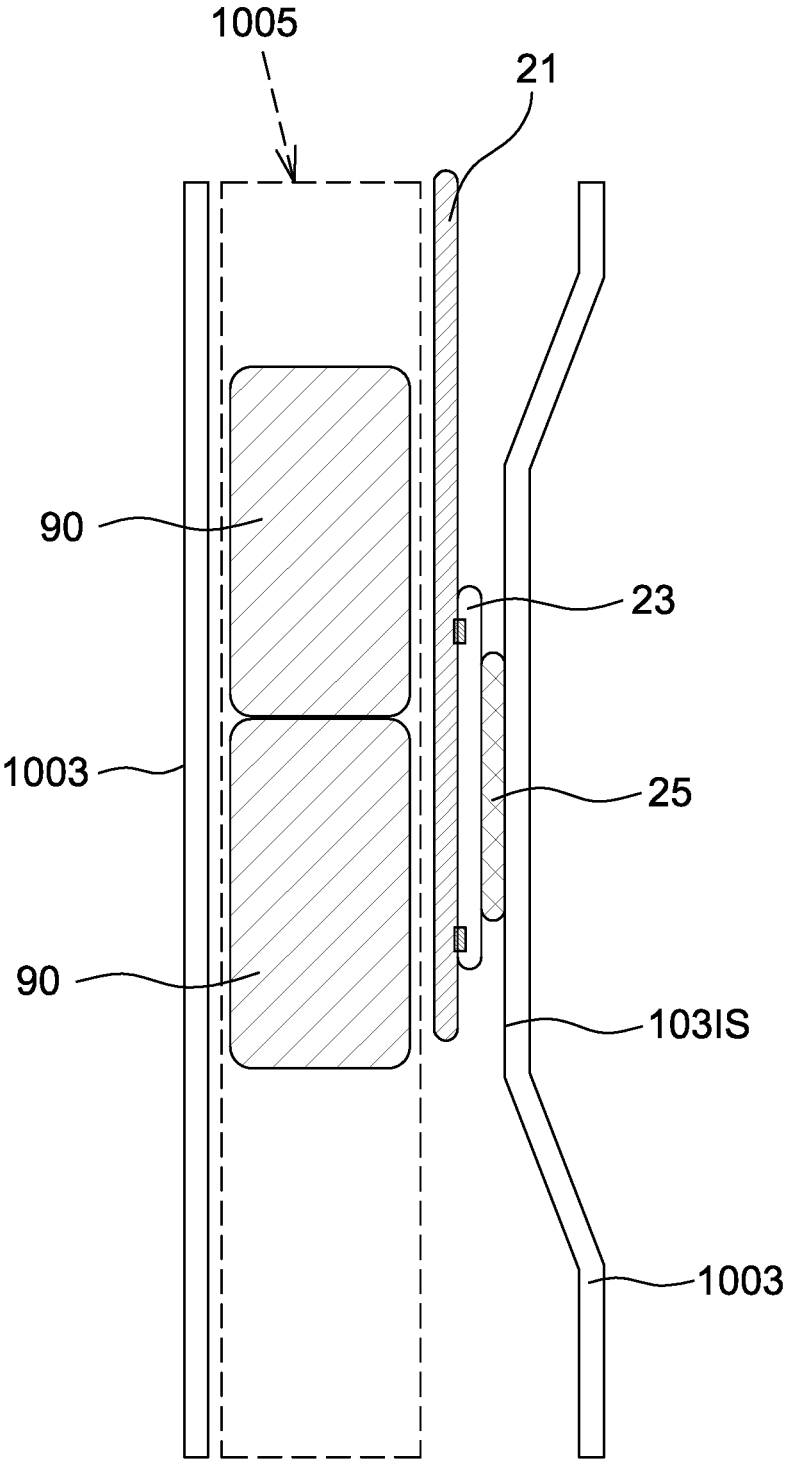
FIG. 10C is a cross sectional view along line C-C' in the earphone of FIG. 10A.

Please refer to FIGS. 10B and 10C, FIG. 10B is a cross sectional view along line B-B' in the earphone 1000 of FIG. 10A, and FIG. 10B shows a cross-section of a casing of the stem 1003, a hard element 90 and the force sensor 200 along a radial direction of the stem 1003. FIG. 10C is a cross sectional view along line C-C' in the earphone 1000 of FIG. 10A, and FIG. 10C shows a cross-section of the casing of the stem 1003, the hard element 90 and the force sensor 200 along a length direction of the stem 1003.

It should be mentioned that although the present disclosure is illustrated by taking the force sensor 200 in FIG. 2A as an example, the force sensor 200 is replaceable by the force sensor 700 or 800 respectively shown in FIGS. 7 and 8. After understanding descriptions below, one of ordinary skill in the art would also understand the implementation of arranging the force sensor 700 or 800 inside the stem 1003.

The stem 1003 has an inner surface 103IS surrounding an inner space 1005 (e.g., shown as a space inside the dashed line). It should be mentioned that the inner space 1005 also includes the space of the force sensor 200, but FIGS. 10B and 10C show that the dashed line does not include the force sensor 200 for describing a space for containing other element(s). The force sensor 200 is attached to one side (e.g., shown as right side in FIGS. 10B and 10C) of the inner surface 103IS. In one aspect, said one side of the inner surface 103IS arranged with the force sensor 200 is a plane surface, and other sides of the inner surface 103IS other than said one side are curved surfaces as shown in FIG. 10B, but the present disclosure is not limited thereto. In another aspect, the whole inner surface 103IS of the stem 1003 is manufactured as a curved surface or as connected plane surfaces, without particular limitations.

As mentioned above, the force sensor 200 includes a substrate 21, a polymer material layer 23, an adhesive layer 231 (not shown in FIGS. 10B and 10C) and a bump 25. A first surface of the substrate 21 (e.g., right side in FIGS. 10B and 10C) is laid with a drive electrode 211 and a sensing electrode 213. The polymer material layer 23 covers on the drive electrode 211 and the sensing electrode 213. The adhesive layer 231 is used to adhere the polymer material layer 23 to the first surface of the substrate 21, and the adhesive layer 231 is arranged at an edge area of the polymer material layer 23, as shown in FIG. 2A. The bump 25 is arranged between the polymer material layer 23 and said one side of the inner surface 103IS for defining a sensing region of the force sensor 200. The bump 25 is fixed on the inner surface 103IS using, for example, glue.

The substrate 21 is electrically connected to the speaker 1001 and a wireless transmission module that is used to send and receive audio signals.

Details of every elements of the force sensor 200 have been described above, and thus are not repeated herein.

When the force sensor 200 (or earphone 1000) includes the bump 25, no matter whether said one side of the inner surface 103IS arranged with the force sensor 200 is a plane surface or a curved surface, the bump 25 is well attached to the inner surface 103IS to receive the force from the casing of the stem 1003. When said one side of the inner surface 103IS arranged with the force sensor 200 is a plane surface, in one aspect the force sensor 200 (or earphone 1000) does not include the bump 25, and the polymer material layer 23 is directly attached to the inner surface 103IS of the stem 1003.

The inner space 1005 further contains a hard element 90. One side of the hard element 90 is used to press on or attach to a second surface (e.g., left side shown in FIGS. 10B and 10C) of the substrate 21 such that when the stem 1003 is pressed from an outside surface thereof, the hard element 90 compresses (e.g., referring to FIG. 11A) or decompresses (e.g., referring to FIG. 11B) the polymer material layer 23. In the present disclosure, the hard element 90 is, for example, a battery, a microphone or other elements having predetermined functions. More specifically, when the inner space 1005 is not filled with the hard element 90, a substrate side of the force sensor 200 does not receive any force. The original function (e.g., providing electricity, receiving audio signals) of the hard element 90 is not for pressing on the second surface of the substrate 21, i.e. the hard element 90 having an additional function other than compressing the polymer material layer 23. By the space arrangement of the present disclosure, the hard element 90 further has the function of giving a force to the force sensor 200 when the stem 1003 is pressed (e.g., by fingers of a user) or not pressed.

The shape and number of the hard element 90 are not particularly limited. For example, FIG. 10C shows that there are two hard elements 90 inserted inside the stem 1003. When the user presses on an outer surface of the stem 1003, at least one of the two hard elements 90 give a force to the force sensor 200 depending on the spatial relationship between the two hard elements 90 and the force sensor 200.

The operation corresponding to the pressing on an outer surface of the stem 1003 is not particularly limited, e.g., turning on/off the speaker 1001, turning on/off the Bluetooth connection, taking a phone call, depending on different applications.

By arranging the force sensor 200 inside the stem 200 and arranging a mass block (i.e. the hard element 90) beside the substrate 21, the earphone 1000 of the present disclosure further detects shaking of the earphone 1000 through the force sensor 200. A processor (e.g., an ASIC or DSP arranged on the substrate 21) of the earphone 1000 distinguishes whether the earphone 1000 is properly worn or not according to detection signals of the force sensor 200. For example, the signal pattern under proper wearing is different from the signal pattern under improper wearing. The processor further performs other controls according to the shaking signal detected by the force sensor 200, e.g., deactivating the speaker 1003 when the earphone 1000 is not properly worn or giving a warning voice, but not limited thereto.

Figure 11A:
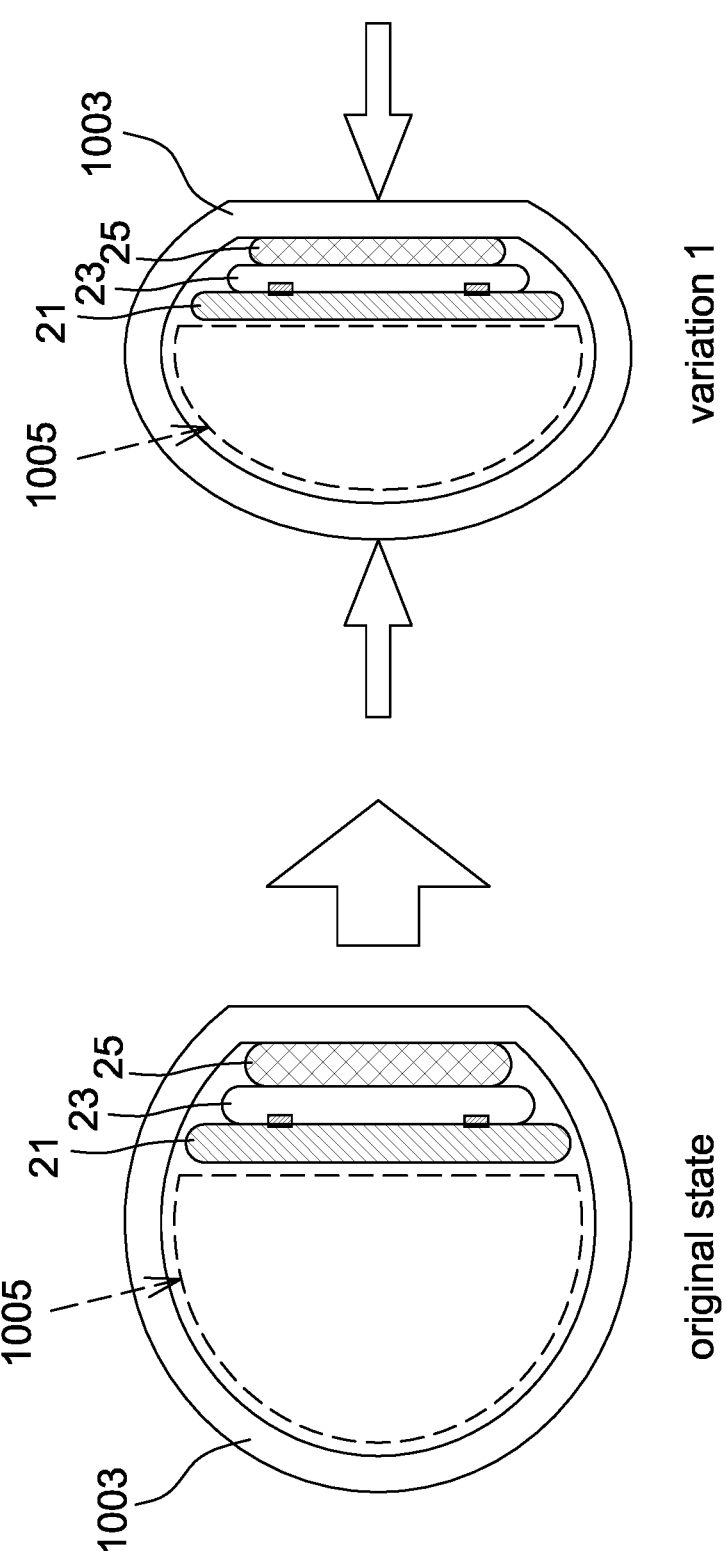
FIG. 11A is a schematic diagram of a stem of a force sensor of the present disclosure being pressed by a force along a first direction.
Figure 11B:
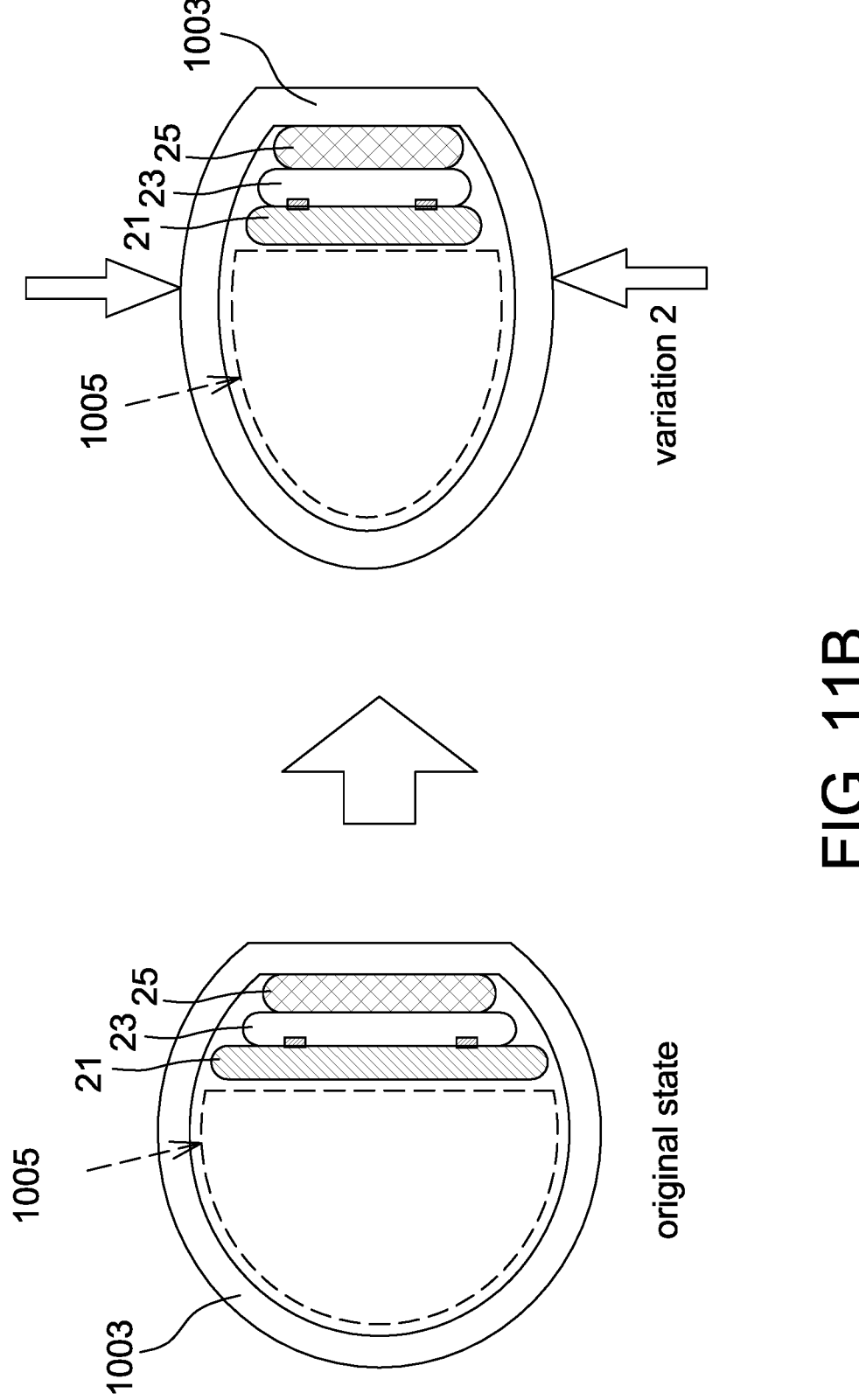
FIG. 11B is a schematic diagram of a stem of a force sensor of the present disclosure being pressed by a force along a second direction.

In another aspect, the earphone 1000 of the present disclosure further detects forces from two different directions. For example referring to FIG. 11A, when a user gives a force on the stem 1003 along a direction of arranging the force sensor 200 (e.g., left-right direction in FIG. 11A), the force sensor 200 detects that the force becomes larger, and the stem 1003 is changed from an original state to a variation 1 as shown in FIG. 11A. For example referring to FIG. 11B, when a user gives a force on the stem 1003 along a perpendicular direction of arranging the force sensor 200 (e.g., up-down direction in FIG. 11B), the force sensor 200 detects that the force becomes smaller, and the stem 1003 is changed from an original state to a variation 2 as shown in FIG. 11B. In this aspect, under the original state, the hard element 90 arranged inside the inner space 1005 preferably gives a reference force to the force sensor 200 such that the detected force of the force sensor 200 can be increased or decreased.

It should be mentioned that FIGS. 11A and 11B exaggeratedly show the shape variation of the stem 1003 under an external force. As mentioned above, because the force sensor of the present disclosure detects the force based on the dielectric constant change instead of the change of distance between electrodes, in actual operation the stem 1003 only has a tiny change or almost has no change under the external force.

In the present disclosure, a surface (e.g., right surface shown in FIGS. 10B and 10C) of the hard element 90 is directly attached to and pressing on the surface of the substrate 21, or a soft or thin separation wall is arranged between the substrate 21 and the hard element 90 to distinguish the space of the force sensor 200.

The above embodiment is described in the way that the drive electrode and the sensing electrode are arranged at the same side of the polymer material layer as an example, but the present disclosure is not limited thereto. In other aspects, the drive electrode and the sensing electrode are respectively located at different sides of the polymer material layer.

Figure 12:
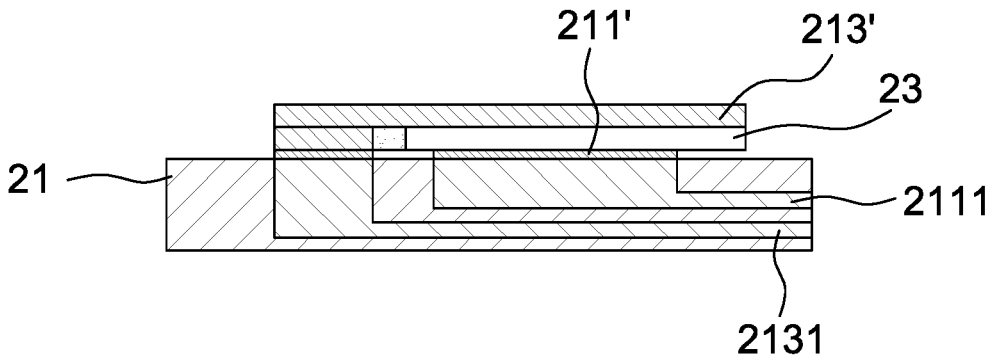
FIG. 12 is a cross sectional view of a force sensor according to another embodiment of the present disclosure.

Please refer to FIG. 12, it is a cross sectional view of a force sensor 200' according to another embodiment of the present disclosure. The force sensor 200' includes a substrate 21, a drive electrode 211', a sensing electrode 213' and a polymer material layer 23, wherein positions of the drive electrode 211' and the sensing electrode 213' are exchangeable. Similarly, in some aspects, the force sensor 200' further includes a bump 25 (as shown in FIG. 14A) for defining a sensing region of the force sensor 200' and used as a buffer between the force sensor 200' and the stem 1003.

Figure 14A:
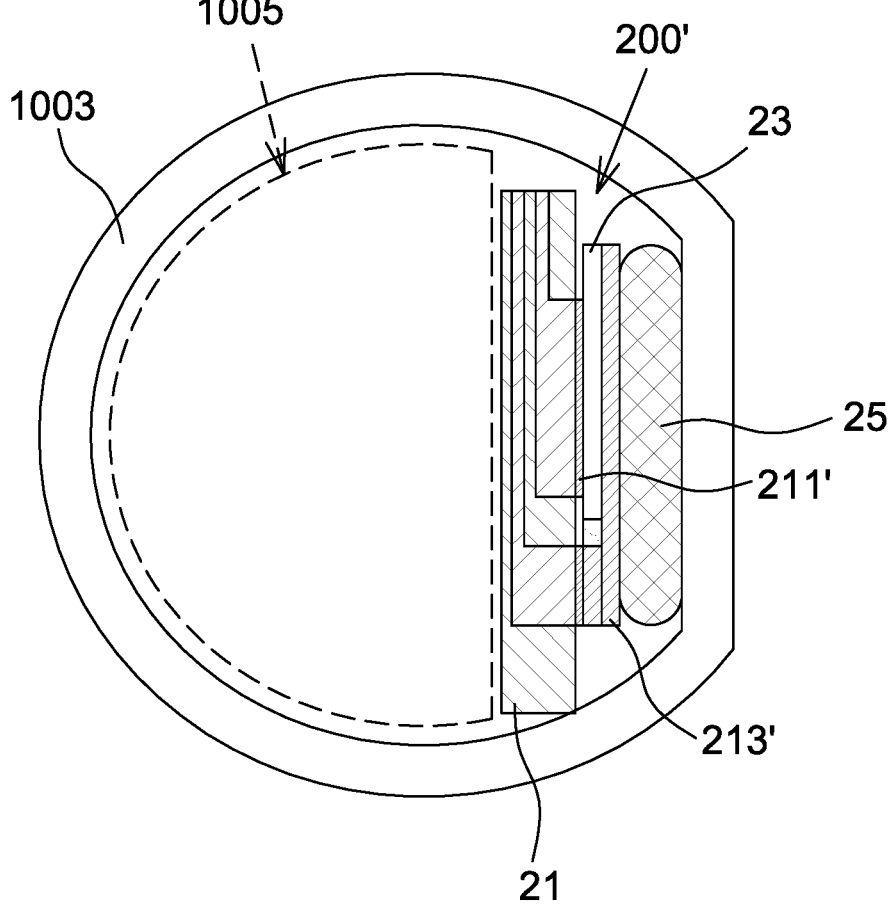
FIG. 14A is a cross sectional view of a stem of an earphone adopting a force sensor of FIG. 12.

FIG. 14A is a cross sectional view of a force sensor 200' arranged inside the stem 1003.

As shown in FIGS. 12 and 14A, a first surface (e.g., an upper surface in FIG. 12 and a right surface in FIG. 14A) of the substrate 21 is laid with a drive line 2111 (e.g., one of the traces mentioned above) and a sensing line 2131 (e.g., one of the traces mentioned above). The drive electrode 211' is electrically connected to the drive line 2111, and the sensing electrode 213' is electrically connected to the sensing line 2131. The drive line 2111 is used to, for example, transmit a drive signal to the drive electrode 211', and the sensing line 2131 is used to, for example, transmit a detection signal of the sensing electrode 213' to the processor. In this aspect, the drive electrode 211' (or sensing electrode) is formed by, for example, a conductive adhesive layer, wherein the conductive adhesive layer is a double sided conductive tape, conductive glue or an anisotropic conductive film (ACF). The polymer material layer 23 is arranged between the drive electrode 211' and the sensing electrode 213'.

When the force sensor 200' further includes a bump 25, the bump 25 is arranged between the sensing electrode 213' (or drive electrode) and said one side of the inner surface 103IS. When the force sensor 200' does not include the bump 25, in one aspect the surface of the sensing electrode 213' (or drive electrode) is directly attached to and pressing on the inner surface 103IS.

Figure 13:
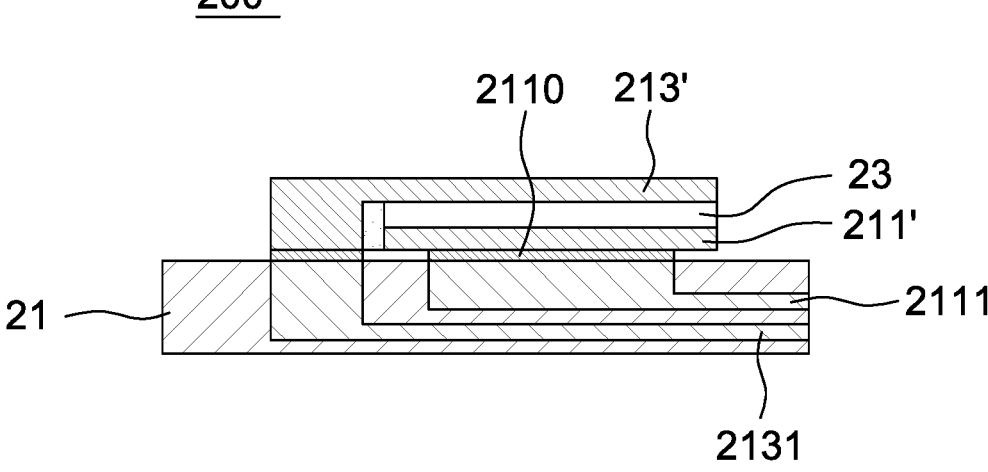
FIG. 13 is a cross sectional view of a force sensor according to an alternative embodiment of the present disclosure.

Please refer to FIG. 13, it is a cross sectional view of a force sensor 200" according to an alternative embodiment of the present disclosure. The force sensor 200" also includes a substrate 21, a drive electrode 211', a sensing electrode 213' and a polymer material layer 23 disposed between the drive electrode 211' and the sensing electrode 213'. The difference between embodiments of FIG. 13 and FIG. 12 is that a conductive adhesive layer 2110 in FIG. 13 is not used as the drive electrode 211' (or sensing electrode). The conductive adhesive layer 2110 is only used to combine (by adhering) the drive electrode 211' to the drive line 2111, and combine (by adhering) the sensing electrode 213' to the sensing line 2131. The conductive adhesive layer 2110 is also selected from a double sided conductive tape, conductive glue or an anisotropic conductive film.

As mentioned above, in other aspects, positions of the drive electrode 211' and the sensing electrode 213' are exchangeable, and thus now the element 2111 is used a sensing line and the element 2131 is used as a drive line.

Figure 14B:
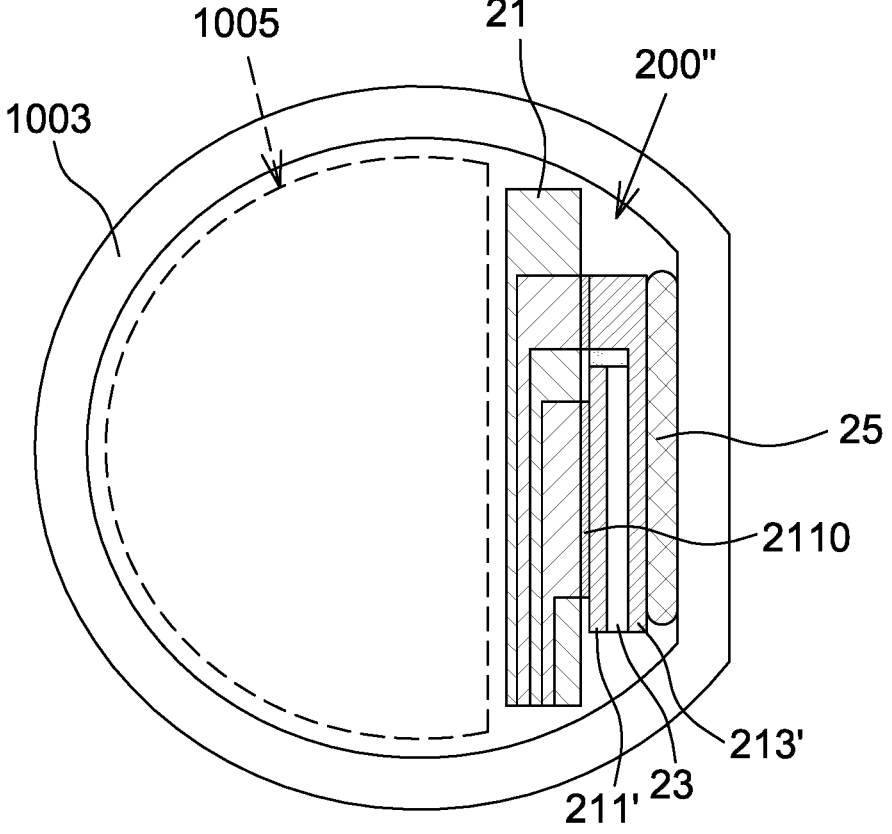
FIG. 14B is a cross sectional view of a stem of an earphone adopting a force sensor of FIG. 13.

FIG. 14B is a cross sectional view of a force sensor 200'' arranged inside the stem 1003. Similarly, when the force sensor 200'' further includes a bump 25, the bump 25 is arranged between the sensing electrode 213' (or drive electrode) and said one side of the inner surface 103IS. When the force sensor 200'' does not include the bump 25, in one aspect the surface of the sensing electrode 213' (or drive electrode) is directly attached to and pressing on the inner surface 103IS of the step 1003.

Similarly, in FIGS. 14A and 14B, the second surface of the substrate 21 of the force sensors 200' and 200'' is directly attached to and pressing on the hard element (as shown in FIGS. 10B and 10C) contained in the inner space 1005, or via a separation wall therebetween.

In other aspects, the inner surface 103IS of the stem 1003 of the earphone 1000 is arranged with two force sensors arranged at different angles to respectively detect forces and/or shaking from different directions.

In another aspect, arranged positions of the substrate and the bump are exchanged (i.e. rotated by 180 degrees) such that the substrate is attached to the inner surface 103IS and the bump is attached to one side of the hard element 90.

It is appreciated that the number of components such as a number of the electrodes, traces, bumps, polymer material layers and adhesive layers herein are only intended to illustrate but not to limit the present disclosure.

As mentioned above, the conventional force sensor is not directly integrated with a circuit board such that an additional connector is required to connect said conventional force sensor to the circuit board. Accordingly, the present disclosure further provides a force sensor (e.g., FIGS. 2-8) and a manufacturing method thereof (e.g., FIG. 9). The drive electrode and the sensing electrode of the force sensor are formed on the circuit board together with the manufacturing of the circuit board. Finally, the manufacturing of the force sensor is accomplished only by attaching and adhering a polymer material layer to an electrode region such that the force sensor of the present disclosure has a simple manufacturing process and low cost.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A device for detecting user input, comprising:
a stem, having an inner surface surrounding an inner space; and
a force sensor, attached to one side, which is a plane surface, of the inner surface, and comprising:
a substrate, laid with a drive electrode and a sensing electrode on a first surface thereof; and
a polymer material layer, different from the substrate, and covering on the drive electrode and the sensing electrode,
wherein the inner space is configured to contain a hard element which is configured to compress the polymer material layer when the stem is pressed, and

the force sensor is configured to detect a force pressing on the stem according to a dielectric constant change of the polymer material layer instead of a distance change between the drive electrode and the sensing electrode.

2. The device as claimed in claim 1, wherein the rest of the inner surface other than said one side is a curved surface.

3. The device as claimed in claim 1, wherein the hard element is a battery, and one side of the battery is configured to press on a second surface, opposite to the first surface, of the substrate.

4. The device as claimed in claim 1, wherein the hard element is a microphone, and one side of the microphone is configured to press on a second surface, opposite to the first surface, of the substrate.

5. The device as claimed in claim 1, further comprising a bump arranged between the polymer material layer and said one side of the inner surface.

6. The device as claimed in claim 1, wherein
the force sensor further comprises an adhesive layer configured to adhere the polymer material layer to the first surface of the substrate, and
the adhesive layer is arranged at an edge area of the polymer material layer.

7. The device as claimed in claim 6, wherein the substrate is further laid with a metal layer on the first surface thereof configured to be adhered with the adhesive layer.

8. The device as claimed in claim 6, wherein
the polymer material layer is repeatedly attachable and detachable with the first surface of the substrate via the adhesive layer, and
the polymer material layer further covers on a space between the drive electrode and the sensing electrode.

9. The device as claimed in claim 6, wherein
the force sensor further comprises a carrying layer attached to a surface of the polymer material layer not facing the substrate, and
an area of the carrying layer is larger than the polymer material layer.

10. The device as claimed in claim 9, wherein the adhesive layer is arranged on the carrying layer.

11. A device for detecting user input, comprising:
a stem, having an inner surface surrounding an inner space; and
a force sensor, attached to one side, which is a plane surface, of the inner surface, and comprising:
a substrate, laid with a drive line and a sensing line on a first surface thereof;
a drive electrode, electrically connected to the drive line;
a sensing electrode, electrically connected to the sensing line; and
a polymer material layer, different from the substrate, and arranged between the drive electrode and the sensing electrode,
wherein the inner space is configured to contain a hard element which is configured to compress the polymer material layer when the stem is pressed, and
the force sensor is configured to detect a force pressing on the stem according to a dielectric constant change of the polymer material layer instead of a distance change between the drive electrode and the sensing electrode.

12. The device as claimed in claim 11, wherein the rest of the inner surface other than said one side is a curved surface.

13. The device as claimed in claim 11, wherein the hard element is a battery, and one side of the battery is configured to press on a second surface, opposite to the first surface, of the substrate.

14. The device as claimed in claim 11, wherein the hard element is a microphone, and one side of the microphone is configured to press on a second surface, opposite to the first surface, of the substrate.

15. The device as claimed in claim 11, further comprising a bump arranged between the sensing electrode and said one side of the inner surface.

16. The device as claimed in claim 11, further comprising a conductive adhesive layer configured to adhere the drive electrode to the drive line, and to adhere the sensing electrode to the sensing line.

17. The device as claimed in claim 16, wherein the conductive adhesive layer is a double sided conductive tape, conductive glue or an anisotropic conductive film.

18. The device as claimed in claim 11, wherein the drive electrode is formed by a conductive adhesive layer.

19. The device as claimed in claim 11, further comprising a separation wall between the substrate and the hard element.

20. A device for detecting user input, comprising:

a stem, having an inner surface surrounding an inner space; and a force sensor, attached to one side, which is a plane surface, of the inner surface, and comprising:

a substrate; and a polymer material layer, different from the substrate, and attached to one side of the substrate and having a changeable dielectric constant upon being pressed, wherein the inner space is configured to contain a mass block which is configured to compress an opposite side of the one side of the force sensor when the stem is pressed, and the force sensor is configured to detect a force pressing on the stem according to a dielectric constant change of the polymer material layer.

* * * * *